(12) United States Patent
Heidenreich et al.

(10) Patent No.: US 10,103,571 B2
(45) Date of Patent: *Oct. 16, 2018

(54) UNINTERRUPTIBLE POWER SUPPLIES FOR USE IN A DISTRIBUTED NETWORK

(71) Applicant: Alpha Technologies Inc., Bellingham, WA (US)

(72) Inventors: James Joseph Heidenreich, Bellingham, WA (US); Ronald Jay Roybal, Bellingham, WA (US); Thanh Quoc Le, Ferndale, WA (US); Pankaj H. Bhatt, Bellingham, WA (US)

(73) Assignee: Alpha Technologies Inc., Bellingham, WA (US)

( * ) Notice: Subject to any disclaimer, the term of this patent is extended or adjusted under 35 U.S.C. 154(b) by 190 days.

This patent is subject to a terminal disclaimer.

(21) Appl. No.: 15/096,177

(22) Filed: Apr. 11, 2016

(65) Prior Publication Data

US 2016/0226303 A1 Aug. 4, 2016

Related U.S. Application Data

(63) Continuation of application No. 13/352,317, filed on Jan. 17, 2012, now Pat. No. 9,312,726.

(Continued)

(51) Int. Cl.
*H02J 7/00* (2006.01)
*H02J 9/00* (2006.01)
(Continued)

(52) U.S. Cl.
CPC .......... *H02J 9/061* (2013.01); *H01M 10/441* (2013.01); *H01M 10/443* (2013.01);
(Continued)

(58) Field of Classification Search
CPC ...... H02J 7/00; H02J 9/00; H02B 7/00; G01R 19/52; G01R 19/00; G01R 31/36; G05F 1/16
(Continued)

(56) References Cited

U.S. PATENT DOCUMENTS 1,718,238 A 6/1929 Kettering et al.
2,007,415 A 7/1935 Walker
(Continued)

FOREIGN PATENT DOCUMENTS

AU 2029495 12/1995
CA 1265231 1/1990
(Continued)

OTHER PUBLICATIONS

Batson et al., Solving the Powering Requirements of Broadband Dial Tone Service, 1994, 3 pages.
(Continued)

*Primary Examiner* — Rexford Barnie
*Assistant Examiner* — Jagdeep Dhillon
(74) *Attorney, Agent, or Firm* — Michael R. Schacht; Schacht Law Office, Inc.

(57) ABSTRACT

A diagnostic system for a UPS module has a battery diagnostics module, an inverter diagnostic module, a utility diagnostic module, and a transformer diagnostic module. The battery diagnostic module is configured to generate battery diagnostic information based on at least one operating characteristic of at least one element of the battery module. The inverter diagnostic module is configured to generate inverter diagnostic information based on at least one operating characteristic of at least one element of the inverter module. The utility diagnostic module is configured to generate utility diagnostic information based on at least one operating characteristic of at least one element of the
(Continued)

utility power signal supplied by the utility power supply. The transformer diagnostic module is configured to generate transformer diagnostic information based on at least one operating characteristic of at least one element of the transformer module.

20 Claims, 1 Drawing Sheet

Related U.S. Application Data (60) Provisional application No. 61/435,332, filed on Jan. 23, 2011.

(51) Int. Cl.
| | | |
|---|---|---|
| *H02J 9/06* | (2006.01) | |
| *H01M 10/44* | (2006.01) | |
| *G01R 31/36* | (2006.01) | |
| *G06F 19/00* | (2018.01) | |
| *H02H 3/00* | (2006.01) | |
| *H02B 1/20* | (2006.01) | |
| *H02J 1/00* | (2006.01) | |
| *H02B 13/02* | (2006.01) | |
| *H01M 10/48* | (2006.01) | |
| *H01M 10/42* | (2006.01) | |

(52) U.S. Cl.
CPC ............ *H02J 7/0068* (2013.01); *H02J 9/062* (2013.01); *G01R 31/36* (2013.01); *G06F 19/00* (2013.01); *H01M 10/48* (2013.01); *H01M 2010/4271* (2013.01); *H02B 1/20* (2013.01); *H02B 13/02* (2013.01); *H02H 3/00* (2013.01); *H02J 1/00* (2013.01); *H02J 7/00* (2013.01); *H02J 9/00* (2013.01); *Y10T 307/344* (2015.04)

(58) Field of Classification Search
USPC .................................. 307/43, 46, 48, 66, 150
See application file for complete search history.

(56) References Cited

U.S. PATENT DOCUMENTS

| | | |
|---|---|---|
| 2,014,101 A | 9/1935 | Bryan |
| 2,037,183 A | 4/1936 | Strieby |
| 2,063,994 A | 12/1936 | Frank et al. |
| 2,085,072 A | 6/1937 | Bobe |
| 2,165,969 A | 7/1939 | Humbert et al. |
| 2,240,123 A | 4/1941 | Shoup et al. |
| 2,302,192 A | 11/1942 | Dannheiser |
| 2,427,678 A | 9/1947 | Laging |
| 2,688,704 A | 9/1954 | Christenson |
| 2,856,543 A | 10/1958 | Dixon et al. |
| 2,920,211 A | 1/1960 | Gotoh |
| 3,064,195 A | 11/1962 | Freen |
| 3,221,172 A | 11/1965 | Rolison |
| 3,283,165 A | 11/1966 | Bloch |
| 3,293,445 A | 12/1966 | Levy |
| 3,305,762 A | 2/1967 | Geib, Jr. |
| 3,339,080 A | 8/1967 | Howald |
| 3,345,517 A | 10/1967 | Smith |
| 3,348,060 A | 10/1967 | Jamieson |
| 3,435,358 A | 3/1969 | Rheinfelder |
| 3,458,710 A | 7/1969 | Dodge |
| 3,525,035 A | 8/1970 | Kakalec |
| 3,525,078 A | 8/1970 | Baggott |
| 3,636,368 A | 1/1972 | Sia |
| 3,678,284 A | 7/1972 | Peters |
| 3,691,393 A | 9/1972 | Papachristou |
| 3,737,858 A | 6/1973 | Turner et al. |
| 3,859,589 A | 1/1975 | Rush |
| 3,943,447 A | 3/1976 | Shomo, III |
| 4,060,844 A | 11/1977 | Davis et al. |
| 4,170,761 A | 10/1979 | Koppehele |
| 4,198,624 A | 4/1980 | Watanabe |
| 4,295,053 A | 10/1981 | Kovatch et al. |
| 4,295,054 A | 10/1981 | Kovatch et al. |
| 4,446,458 A | 5/1984 | Cook |
| 4,460,834 A | 7/1984 | Gottfried |
| 4,475,047 A | 10/1984 | Ebert |
| 4,477,799 A | 10/1984 | Rocci et al. |
| 4,709,318 A | 11/1987 | Gephart et al. |
| 4,719,550 A | 1/1988 | Powell et al. |
| 4,733,223 A | 3/1988 | Gilbert |
| 4,745,299 A | 5/1988 | Eng et al. |
| 4,748,341 A | 5/1988 | Gupta |
| 4,748,342 A | 5/1988 | Dijkmans |
| 4,763,014 A | 8/1988 | Model et al. |
| 4,885,474 A | 12/1989 | Johnstone et al. |
| 4,922,125 A | 5/1990 | Casanova et al. |
| 4,943,763 A | 7/1990 | Bobry |
| 4,975,649 A | 12/1990 | Bobry |
| 5,010,469 A | 4/1991 | Bobry |
| 5,017,800 A | 5/1991 | Divan |
| 5,029,285 A | 7/1991 | Bobry |
| 5,057,698 A | 10/1991 | Widener et al. |
| 5,172,009 A | 12/1992 | Mohan |
| 5,185,536 A | 2/1993 | Johnson, Jr. et al. |
| 5,198,698 A | 3/1993 | Paul et al. |
| 5,198,970 A | 3/1993 | Kawabata et al. |
| 5,200,586 A | 4/1993 | Smith et al. |
| 5,220,597 A | 6/1993 | Horiuchi |
| 5,237,208 A | 8/1993 | Tominaga et al. |
| 5,241,591 A | 8/1993 | Saji |
| 5,302,858 A | 4/1994 | Folts |
| 5,400,005 A | 3/1995 | Bobry |
| 5,410,720 A | 4/1995 | Osterman |
| 5,440,179 A | 8/1995 | Severinsky |
| 5,457,377 A | 10/1995 | Jonsson |
| 5,467,384 A | 11/1995 | Skinner, Sr. |
| 5,532,525 A | 7/1996 | Kaiser et al. |
| 5,579,197 A | 11/1996 | Mengelt et al. |
| 5,581,246 A | 12/1996 | Yarberry et al. |
| 5,602,462 A * | 2/1997 | Stich ............... G05F 1/147 307/64 |
| 5,610,451 A | 3/1997 | Symonds |
| 5,638,244 A | 6/1997 | Mekanik et al. |
| 5,642,002 A | 6/1997 | Mekanik et al. |
| 5,664,002 A | 9/1997 | Skinner, Sr. |
| 5,734,831 A | 3/1998 | Sanders |
| 5,739,595 A | 4/1998 | Mekanik et al. |
| 5,760,495 A | 6/1998 | Mekanik |
| 5,892,431 A | 4/1999 | Osterman |
| 5,961,604 A | 10/1999 | Anderson et al. |
| 5,994,793 A | 11/1999 | Bobry |
| 6,014,015 A | 1/2000 | Thorne et al. |
| 6,288,916 B1 | 9/2001 | Liu et al. |
| 6,348,782 B1 | 2/2002 | Oughton et al. |
| 6,456,036 B1 | 9/2002 | Thandiwe |
| 6,486,399 B1 | 11/2002 | Armstrong et al. |
| 6,602,627 B2 | 8/2003 | Liu et al. |
| 6,768,722 B1 | 7/2004 | Katseff et al. |
| 6,841,971 B1 | 1/2005 | Spec et al. |
| 6,933,626 B2 | 8/2005 | Oughton, Jr. |
| 7,040,920 B2 | 5/2006 | Johnson, Jr. et al. |
| 7,182,632 B1 | 2/2007 | Johnson, Jr. et al. |
| 7,543,328 B2 | 6/2009 | Bialk et al. |
| 7,567,520 B2 | 7/2009 | Ostrosky |
| 7,835,379 B2 | 11/2010 | Dravida et al. |
| 8,074,888 B2 | 12/2011 | Naccache |
| 8,344,685 B2 | 1/2013 | Bertness et al. |
| 8,616,457 B2 | 12/2013 | Krawczewicz et al. |
| 9,312,726 B2 | 4/2016 | Heidenreich et al. |
| 2001/0033502 A1 | 10/2001 | Blair et al. |
| 2003/0046706 A1 | 3/2003 | Rakib |
| 2003/0048006 A1 * | 3/2003 | Shelter, Jr. ............... H02J 9/061 307/64 |
| 2004/0031059 A1 | 2/2004 | Bialk et al. |
| 2005/0096772 A1 | 5/2005 | Cox et al. |
| 2006/0168612 A1 | 7/2006 | Chapman et al. |
| 2007/0002875 A1 | 1/2007 | Rocci et al. |

(56) References Cited

U.S. PATENT DOCUMENTS

| | | |
|---|---|---|
| 2008/0024268 A1 | 1/2008 | Wong et al. |
| 2008/0203820 A1 | 8/2008 | Kramer et al. |
| 2008/0278006 A1* | 11/2008 | Gottlieb ............. G01R 31/3648 307/66 |
| 2009/0076661 A1 | 3/2009 | Pearson et al. |
| 2009/0240377 A1 | 9/2009 | Batzler et al. |
| 2010/0008397 A1 | 1/2010 | Johnson |
| 2010/0045107 A1 | 2/2010 | Cohen et al. |
| 2010/0161259 A1* | 6/2010 | Kim ................... G05B 23/0283 702/63 |
| 2010/0250192 A1 | 9/2010 | Deokar et al. |
| 2010/0324548 A1 | 12/2010 | Godara et al. |
| 2010/0328851 A1* | 12/2010 | Jurek ...................... H02B 1/21 361/639 |
| 2011/0187197 A1 | 8/2011 | Moth |
| 2011/0238345 A1 | 9/2011 | Gauthier et al. |
| 2011/0273151 A1 | 11/2011 | Lesso et al. |
| 2012/0091811 A1 | 4/2012 | Heidenreich et al. |
| 2012/0212051 A1 | 8/2012 | Heidenreich et al. |
| 2012/0217800 A1 | 8/2012 | Heidenreich et al. |
| 2012/0217806 A1 | 8/2012 | Heidenreich et al. |
| 2012/0217808 A1 | 8/2012 | Richardson et al. |

FOREIGN PATENT DOCUMENTS

| | | |
|---|---|---|
| CA | 2033685 | 10/1991 |
| CA | 2036296 | 11/1991 |
| CA | 1297546 | 3/1992 |
| CA | 2086897 | 7/1993 |
| CA | 2028269 | 1/2000 |
| CA | 2149845 | 2/2000 |
| CA | 2168520 | 4/2003 |
| CA | 2403888 | 5/2007 |
| CA | 2713017 | 7/2009 |
| CA | 2504101 | 5/2010 |
| CA | 2760581 | 11/2010 |
| CN | 101330686 | 3/2012 |
| EP | 2425515 | 3/2012 |
| EP | 2587620 A2 | 5/2013 |
| GB | 2005118 | 4/1979 |
| GB | 2355350 | 4/2001 |
| GB | 2475612 | 5/2011 |
| JP | 2001190035 | 7/2001 |
| JP | 2010252573 | 11/2010 |
| KR | 20070108759 | 11/2007 |
| RU | 2191459 | 10/2002 |
| WO | 2009094540 | 7/2009 |
| WO | 2010135406 A1 | 11/2010 |
| WO | 2012099911 | 7/2012 |

OTHER PUBLICATIONS

Eto et al., Research, Development, and Demonstration Needs for Large-Scale, Reliability-Enhancing, Integration of Distributed Energy Resources, IEEE Proceedings of the 33rd Hawaii International Conference on System Sciences, 2000, 7 pages.

International Searching Authority, "PCT/US2012/021622", International Search Report, dated May 17, 2012, 7 pages.

Yamada, Research and Development of Telecommunications Energy Systems in NTT, NTT Integrated Infromation and Energy Systems Laboratories, Mar. 9, 2011, 8 pages.

International Searching Authority, PCT Notification of Transmittal of the International Search Report and the Written Opinion of the International Searching Authority, or the Declaration, dated Dec. 8, 2016, 8 pages.

\* cited by examiner

UNINTERRUPTIBLE POWER SUPPLIES FOR USE IN A DISTRIBUTED NETWORK

RELATED APPLICATIONS

This application, U.S. patent application Ser. No. 15/096,177 filed Apr. 11, 2016 is a continuation of U.S. patent application Ser. No. 13/352,317 filed Jan. 17, 2012, now U.S. Pat. No. 9,312,726 issued Apr. 12, 2016.

U.S. patent application Ser. No. 13/352,317 claims benefit of U.S. Provisional Patent Application Ser. No. 61/435,332 filed Jan. 23, 2011.

The contents of the related application(s) listed above are incorporated herein by reference.

TECHNICAL FIELD

The present invention relates the generation of a standby power signal and, more specifically, to uninterruptible power supply systems adapted for use as part of a larger distributed network.

BACKGROUND

Uninterruptible power supplies (UPS's) have long been used to provide at least temporary auxiliary power to electronic devices. A UPS is typically configured to switch between a primary power source and a standby power source as necessary to maintain constant power to a load.

Typically, the primary power source for a UPS is a utility power supply, and the standby power source may take the form of a battery system. The UPS will normally operate in a line mode in which the utility power signal is passed to the load when the utility power signal is within predefined parameters. In the line mode, the UPS will typically also charge the battery system. When the utility power falls outside of the predefined parameters, the UPS will switch to standby mode in which an AC signal is generated based on the energy stored in the battery system.

Distributed networks, such as communications networks, typically employ electronics remotely deployed across a wide geographical area. Examples of such distributed networks include CATV systems, conventional telephony systems, and cellular telephone towers.

Remotely deployed electronic devices typically obtain primary power from a local source, and the local power source is typically outside of the direct control of the operator of the distributed network. Where possible, remote electronics obtain primary power from an electrical power utility or the like. Where utility electrical power is unavailable, the primary power source may be provided by a generator powered by natural gas, propane, gasoline, or diesel oil or by an alternative energy source such as a wind generator or solar power panels. Whatever the source of primary power, a UPS is typically provided to provide standby power during periods of time in which the primary power source is unavailable for any reason.

In addition, such remotely deployed electronic devices are often left unattended for long periods of time. Maintenance and/or repair of remotely deployed electronic devices in a distributed network, as well as any UPS systems associated therewith, typically require the mobilization of a truck and crew. Desirably, the mobilization of a truck and crew for routine maintenance is minimized to reduce costs.

A special concern arises when a widespread utility power failure is experienced. In this situation, decisions must be made as to where to deploy trucks and crews. Improper deployment of trucks and crews may result in interruption of network service that could have been avoided with proper deployment of trucks and crews.

Conventionally, UPS systems used in distributed networks are designed to measure certain system parameters and transmit these parameters to a control center responsible for network maintenance and repair. Control centers typically deploy data processing software systems designed to assist with decisions related to maintenance and repair of UPS systems throughout the distributed network.

An object of the present invention is to provide improved data acquisition and processing systems for UPS systems remotely deployed throughout a distributed network.

SUMMARY

In one embodiment, the present invention may be embodied as a diagnostic system for a UPS module comprising a power system comprising a battery module, an inverter module, and a transformer module, where the power system is arranged between a utility power supply supplying a utility power signal and a communications system comprising at least one load. In this embodiment, the diagnostic system comprises a battery diagnostic module, an inverter diagnostic module, a utility diagnostic module, and a transformer diagnostic module. The battery diagnostic module is configured to generate battery diagnostic information based on at least one operating characteristic of at least one element of the battery module. The battery diagnostic information comprises current status information indicative of performance of the battery module if the power system is operated in a standby mode when the battery diagnostic information is generated and projected status information indicative of projected performance of the battery module should the power system be operated in standby mode at some point in time after the diagnostic information is generated. The inverter diagnostic module is configured to generate inverter diagnostic information based on at least one operating characteristic of at least one element of the inverter module. The inverter diagnostic information is indicative of mean time between failure of the inverter module. The utility diagnostic module is configured to generate utility diagnostic information based on at least one operating characteristic of at least one element of the utility power signal supplied by the utility power supply. The transformer diagnostic module is configured to generate transformer diagnostic information based on at least one operating characteristic of at least one element of the transformer module. The transformer diagnostic information is indicative of mean time between failure of the transformer module.

The present invention may also be embodied as a method for generating diagnostic information from a UPS module comprising a power system comprising a battery module, an inverter module, and a transformer module, where the power system is arranged between a utility power supply supplying a utility power signal and a communications system comprising at least one load, the method comprising the following steps. Battery diagnostic information is generated based on at least one operating characteristic of at least one element of the battery module. The battery diagnostic information comprises current status information indicative of performance of the battery module if the power system is operated in the standby mode when the battery diagnostic information is generated and projected status information indicative of projected performance of the battery module should the power system be operated in standby mode at some point in time after the diagnostic information is generated. Inverter diagnostic information is generated based on at least one operating characteristic of at least one element of the inverter module, where the inverter diagnostic information is indicative of mean time between failure of the inverter module. Utility diagnostic information is generated based on at least one operating characteristic of at least one element of the utility power signal supplied by the utility power supply. Transformer diagnostic information is generated based on at least one operating characteristic of at least one element of the transformer module. The transformer diagnostic information is indicative of mean time between failure of the transformer module.

The present invention may also be embodied as a diagnostic system for a UPS module comprising a power system comprising a battery module, an inverter module, and a transformer module, where the power system is arranged between a utility power supply supplying a utility power signal and a communications system comprising at least one load. In this embodiment, the diagnostic system comprises a battery diagnostic module, an inverter diagnostic module, a utility diagnostic module, a transformer diagnostic module, and a communications module. The battery diagnostic module is configured to generate battery diagnostic information based on at least one of voltage, current, internal battery temperature, ambient temperature, charge times, and discharge times associated with the battery module. The battery diagnostic information comprises current status information indicative of performance of the battery module if the power system is operated in the standby mode when the battery diagnostic information is generated and projected status information indicative of projected performance of the battery module should the power system be operated in standby mode at some point in time after the diagnostic information is generated. The inverter diagnostic module is configured to generate inverter diagnostic information based on a temperature within the inverter module associated with an electrolytic capacitor within the inverter module. The inverter diagnostic information is indicative of mean time between failure of the inverter module. The utility diagnostic module is configured to generate utility diagnostic information based on at least one of line surges, line sags, line outages, and line frequency deviation of utility power signal supplied by the utility power supply. The transformer diagnostic module is configured to generate transformer diagnostic information based on a temperature of a resonant capacitor within the transformer module. The transformer diagnostic information is indicative of mean time between failure of the transformer module. The communications module is operatively connected between the diagnostic module and the communications system to transfer battery diagnostic information, inverter diagnostic information, utility diagnostic information, and transformer diagnostic information between the diagnostic system and the cable television system.

DETAILED DESCRIPTION

Figure 1:
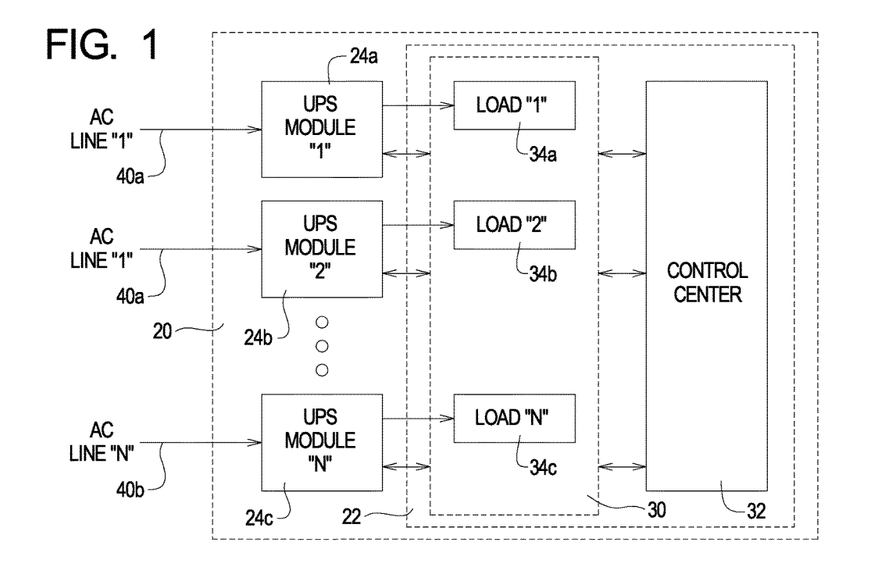
FIG. 1 is a simplified block diagram of a first embodiment of a data acquisition and control system 20 using uninterruptible power supplies constructed in accordance with, and embodying, the principles of the present invention.

Referring initially to FIG. 1 of the drawing, depicted therein is a data acquisition and control system 20 constructed in accordance with, and embodying, the principles of the present invention. The example data acquisition and control (DAC) system 20 comprises a communications system 22 and a plurality of UPS modules 24a, 24b, and 24c. The UPS modules 24a, 24b, and 24c need not be identical but will share certain characteristics and/or requirements as will be described in further detail. In this context, the reference character "24" may be used to refer to any single one of the UPS modules.

FIG. 1 illustrates that the example communications system 22 comprises a communications network 30 and a control center 32 and that a plurality of loads 34a, 34b, and 34c are distributed throughout the communications network 30. The loads 34a, 34b, and 34c need not be identical and may have differing characteristics and/or requirements as will be described in further detail. However, from the perspective of the DAC system 20, the loads 34a, 34b, and 34c can be considered to be substantially the same, and the reference character "34" may be used to refer to any single one of the loads.

In the example DAC system 20, one of the UPS modules 24a, 24b, and 24c is associated with one of the loads 34a, 34b, and 34c. The exact number of UPS modules supplied in any given implementation of the DAC system 20 depends on the details of the communications system 22 and in particular on the number and location of loads distributed through the communications system 22. While three UPS modules 24a, 24b, and 24c and loads 34a, 34b, and 34c are illustrated for simplicity in FIG. 1, it should be apparent that fewer and, more likely, more of the loads and UPS modules will be employed in a typical communications system.

FIG. 1 further illustrates that an AC line is supplied as a primary power source to the each of the UPS modules 24a, 24b, and 24c. In particular, in the example DAC system 20, a utility power line forms an AC line 40a that is supplied to both the first and second UPS modules 24a and 24b. Primary power is provided to the third UPS module 24c through a separate AC line 40b that may be connected, for example, to a generator (not shown) located near the UPS module 24c. Again, the example communications system 22 is somewhat simplified for purposes of clarity and any given communications system may use fewer or more primary power sources and power lines than the two identified in FIG. 1. In this context, the reference character "40" may be used to refer to any single one of the power lines.

Figure 2:
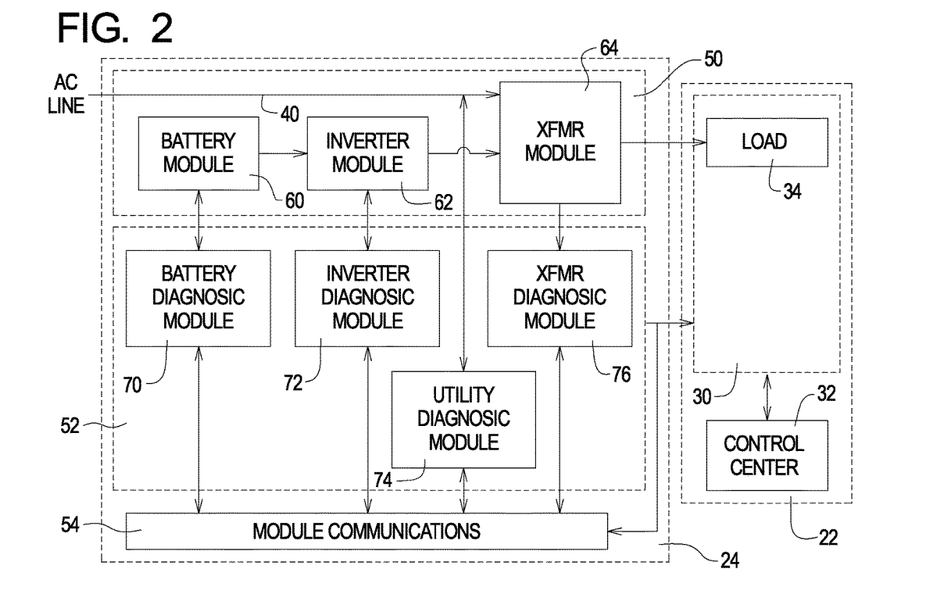
FIG. 2 is a somewhat schematic view of a UPS system forming a part of the data acquisition and control system depicted in FIG. 1.

Turning now to FIG. 2 of the drawing, the details of the example UPS system 24 forming a part of the DAC system 20 will now be described in further detail. FIG. 2 further shows that the example UPS system 24 comprises a power system 50, a diagnostic system 52, and a communications system 54. The communications system 54 is or may be conventional and allows data to be transmitted between the UPS system 24 and the control center 32 through the communications network 30. The communications network will not be described herein beyond that extent necessary for a complete understanding of the present invention.

The example power system 50 comprises a battery module 60, an inverter module 62, and a transformer module 64. The example power system 50 conventionally operates in a line mode in which a line AC output signal is supplied to the load 34 based on the primary power signal on the AC line 40. When the primary power signal on the AC line is absent or does not fall within certain predetermined parameters, the power system 50 operates in a standby mode in which a standby AC output signal is supplied to the load 34 based on power stored in the battery module 60. The specifications of the power system 50 will be determined by the requirements of the particular load 34 to which the power system 50 is connected. These requirements typically include the minimum peak power provided to the load and the minimum expected time period for which power is to be supplied in standby mode.

Power systems suitable for use as the example power system 50 are described, for example, in copending U.S. Patent Applications Ser. Nos. 60/305,926 (UPDATE), 12/803,787, 61/435,298 (UPDATE), and 61/435,317 (UPDATE), and those applications are incorporated herein by reference. The principles of the present invention may, however, be applied any conventional UPS system.

The example diagnostic system 52 comprises a battery diagnostic module 70, an inverter diagnostic module 72, a utility diagnostic module 74, and a transformer diagnostic module 76. These modules 70, 72, 74, and 76 may be implemented separately in hardware and/or may be software modules running on one or more processors. In any event, any combination of hardware modules and/or software modules capable of carrying out the logic described below may be used to implement the diagnostic system 52. Each of these modules 70, 72, 74, and 76 will be discussed in further detail below.

1. Battery Diagnostic Module

Referring initially to the battery diagnostic module 70, that module 70 is connected to the battery module 60 to measure one or more parameters associated with individual batteries, individual strings comprising a plurality (two or more) of batteries, and/or any battery system comprising a plurality of strings of batteries. Measured parameters include, for example, voltage, current, internal battery temperature, ambient temperature, charge times, discharge times, and the like. Based on these measured parameters, the battery diagnostic module 70 generates both current and projected status information associated with batteries, strings of batteries, and/or the entire battery system.

The example battery diagnostic module 70 is capable of measuring the voltage across and charging individual batteries within the battery module 60. Accordingly, the example battery diagnostic module 70 is capable of generating current and projected status information for individual batteries within the battery module 60. For example, the battery diagnostic module 70 generates current status information estimating how long individual batteries, strings of batteries, and/or the entire battery system will operate within desired parameters should the UPS module 24 be placed in standby mode. The battery diagnostic module 70 may further generate projected status information predicting how long individual batteries, strings of batteries, and/or the entire battery system are likely to operate within desired parameters should the UPS module 24 be placed in standby mode in a week or a month.

The battery diagnostic module 70 transmits any such current and projected status information, along with any raw data associated with the measured parameters associated with the battery module 60, to the control center 32 through the module communications system 54 and the network 30.

2. Inverter Diagnostic Module

The purpose of the inverter diagnostic module 72 is to provide the age of the inverter module 62 and predict the preventive maintenance and replacement alarms. In the example inverter module 62, a battery bus electrolytic capacitor is the primary life limited device and as such will be the benchmark for the calculations performed by the inverter diagnostic module 72 in the example diagnostic system 52.

The example inverter diagnostic module 72 calculates the mean time between failure (MTBF) of the inverter module 62 using the temperature profile mapping operation described below to measure, estimate, and/or determine enclosure ambient temperature. The enclosure ambient temperature is external to the power system 50 and internal to the weather proof enclosure. In the example inverter system 62, the operational temperature of the electrolytic capacitor is computed using a temperature sensor mounted on the inverter heat sink. Experimental testing illustrates that an offset value should be added to the temperature value generated by the temperature sensor, and such value can be calculated for a particular arrangement of inverter components.

Based on the temperature profile and offset value, a weighted average of the temperature profile can be calculated. The weighted average may further be reduced to provide a safety margin to the aging algorithm. The life of the life-limited component, in this case the electrolytic capacitor, is determined using weighted average in MTBF calculations. The life of the life-limited component may be used as the rated life value of the inverter module.

The inverter age calculation may be performed as follows. The primary aging factor for the inverter is the temperature at which it operates.

The design life is rated for a predetermined number of hours at a certain temperature level. The baseline temperature and an expected life of the inverter are used in the inverter age calculation.

The aging algorithm may use an even more aggressive age calculation by requiring the device to age a minimum of one day every calendar day, regardless if the effective calculated age is less than one day per calendar day at temperatures less than the baseline temperature.

In any event, in the example aging algorithm implemented by the example inverter diagnostic module 72, the temperature is sampled hourly and averaged daily. Once the daily average is calculated, the resultant aging will be determined by one of the following two methods depending upon the average daily temperature.

If the average daily temperature is greater than or equal to the baseline temperature, the inverter age in days is equal to the last sample's accumulated age in days+2^[(sample temp−baseline temperature)/10]. Therefore, for every 10 degree rise over baseline temperature, the aging rate doubles. In other words, at 10 degrees over the baseline average for a day, the inverter has aged two days.

If the average daily temperature is less than the baseline, the inverter age in days is equal to the accumulated age in days of the last sample plus 1 day.

The remaining life in days is thus equal to the expected life in days less the inverter age in days.

The inverter diagnostic module generates a warning alarm if the remaining life of the life-limited component (i.e., the electrolytic capacitor) is less than six months.

Replace alarms are generated under the following conditions:
 1. Inverter Heat-sink over-temp shut down;
 2. Utility OK and charger failed alarm activated for more than 6 hours; and
 3. Self-test failed, but the battery is healthy (>11.5V) during the self-test cycle To perform the foregoing calculations, the inverter diagnostic module 72 needs real time temperature information.

In the example module 72, a separate UPS main controller (not shown) communicates the real time temperature to the inverter diagnostic module 72. The UPS main controller also provides messages for the various replace conditions.

The example inverter diagnostic module 72 requires no input screens. The design life of the inverter is hard coded into firmware. Likewise, the alarm threshold is also hard coded into firmware. The manufacturing date of the inverter is provided to the module 72 from the UPS main controller as a logged configuration record.

The example inverter diagnostic module 72 is configured to generate the following output screens. An Inverter Health screen is selected from the main menu.

AlphaAPP v1.0 Status
Inverter Health
Transformer Health
ENTR { } ESC

Pressing ENTR selects the Inverter Health screen. The first line will indicate OK, WRN, or REP as a worst case analysis the inverter module 62.

Inverter WRN
Install Date April 2011
Life Remaining 120M
ESC

The following screens show the REP alarms:
Inverter REP
Heat-sink Over-temp
ESC
Or:
Inverter REP
Utility OK,
Charger Fail>6 Hrs
ESC
Or:
Inverter REP
Battery>11.5V OK,
Self-test Failure
ESC The example inverter diagnostic module 72 provides the following status information hourly to the communications system 56 for upstream use by the control center 32.

Proposed Counter CIBs:
eAPP_Inverter_1_Status (0=OK, 1=WRN (generates minor alarm), 2=REP (generates major alarm)
eAPP_Inverter_Months_Life_Remaining (0 to 120)

The example inverter diagnostic module may further establish a web page indicating, for example, the following status information: Inverter Status (OK, WRN or REP); Inverter Life Remaining in months. This report should be updated every day.

3. Utility Diagnostic Module

The purpose of utility diagnostic module 74 is to provide data logging on the supplied utility feed. This information allows the environment the UPS module 24 (e.g., XM3 system) has been operating in to be characterized. The example utility diagnostic module 74 is designed to store the following data types: Line Surges, Line Sags, Line Outages, and Line Frequency Deviation.

A Line Sag event is captured and defined as an event that causes either of the lower two voltage relays to engage. The example power system 50 contains tap switching relays (not shown) that do not change if the output voltage is within a predetermined tolerance to prevent unnecessary wear of the relays. This type of Line Sag event is not be recorded by the module 74.

The main controller of the UPS system 24 communicates to the utility diagnostic module relay tap changes. In particular, when a tap is switched from "normal", the event will be saved in RAM and time stamped. When the tap is switched back to "normal", the duration of the Sag will then be permanently stored in memory.

This function does not require an input screen, but a utility performance output screen may be provided as will now be described. The utility performance screen indicates either "OK" or "EVT", if the power supply is currently in a utility event (Outage, Sag, Surge, Frequency).

| | | |
|---|---|---|
| Utility Perform | EVT | |
| Sags | EVT | |
| Surges | | |
| ENTR | } | ESC |

The scrollable list entries containing Outages, Sags, Surges and Frequency will each have an "EVT" indicator as appropriate in real time. When the desired performance type is at the top of the list, pressing ENTR will select the current status for this event type if it is in progress, otherwise the display will show the 24 hour history:

| | |
|---|---|
| Sag In Progress | |
| Start Time | 23:52 |
| Duration | 999M |
| } | ESC |

If the down arrow (}) is pressed, the display will show the past 24 hours of status for this event type:

| | |
|---|---|
| Sag 24 Hr History | |
| Avg | 333M |
| Min 111M Max | 444M |
| ENTR { } | ESC |

If the down arrow (}) is pressed, the display will show the total history for this event type:

| | |
|---|---|
| Sag Total History | |
| Events 1111 = | 9999M |
| Min 222M Max | 333M |
| ENTR { | ESC |

Pressing ENTR will select a scrollable list of logged history for that type:

| |
|---|
| Sag Log |
| Date/Time/Duration |
| *** No Entries *** |
| ESC |
| Or: |
| Sag Log |
| Date/Time/Duration |
| 03/19/11 22:35 99M |
| { } ESC |

The current and 24 hour Sag events may be updated every minute. The permanently logged events may be performed daily. In addition, the current and 24 hour information may be presented to the communications module 54 for upstream use.

The following are proposed counter CIBs:
eAPP_Sag_Current_Duration (0 if not in a Sag)
eAPP_Sag_24_Hour_AvgeAPP_Sag_24_Hour_Min
eAPP_Sag_24_Hour_Max
eAPP_Sag_Life_Count
eAPP_Sag_Life_Time
eAPP_Sag_Life_Min
eAPP_Sag_Life_Max The current SAG event time can be calculated from the eAPP_SAG_Current_Duration variable.

The utility diagnostic module may establish a web page indicating the following information:

Report 1 (updated every minute):
Current Status "SAGs",
Current Event Time "V",
Past 24 Hours Average Qty "W",
Past 24 Hour Maximum Time "X",
Past 24 Hour Minimum Time "Y". Update report every minute.

Report 2 (updated every day):
History "SAGs",
System Life Qty Events "Z",
Total Time in SAG Mode "Z2",
Maximum Time in SAG Mode "Z3",
Minimum Time in SAG Mode "Z4".

A Line Surge event is the counterpart to the Line Sag event. In this case, the higher voltage relays have engaged.

The main processor of the example UPS system 24 communicates relay tap changes to the utility diagnostic module 74. When a tap is switched from "normal", the event will be saved in RAM and time stamped. When the tap is switched back to "normal", the duration of the Surge will then be permanently logged in memory. This function of the utility diagnostic module 74 does not require an input screen.

The utility diagnostic module 74 may, however, display the following the utility performance screen indicating either "OK" or "EVT" if the power supply is currently in a utility event (Outage, Sag, Surge, Frequency).

|  |  |
|---|---|
| Utility Perform | EVT |
| Surge | EVT |
| Frequency | |
| ENTR  } | ESC |

The scrollable list entries containing Outages, Sags, Surges and Frequency will each have an "EVT" indicator as appropriate in real time.

When the desired performance type is at the top of the list, pressing ENTR will select the current status for this event type if it is in progress, otherwise the display will show the 24 hour history:

|  |  |
|---|---|
| Surge In Progress | |
| Start Time | 23:52 |
| Duration | 999M |
| } | ESC |

If the down arrow (}) is pressed, the display will show the past 24 hours of status for this event type:

|  |
|---|
| Surge 24 Hr History |
| Avg 333M |
| Min 111M   Max 444M |
| ENTR { }         ESC |

If the down arrow (}) is pressed, the display will show the total history for this event type:

|  |
|---|
| Surge Total History |
| Events 1111 = 9999M |
| Min 222M   Max 333M |
| ENTR {         ESC |

Pressing ENTR will select a scrollable list of logged history for that type:

|  |
|---|
| Surge Log |
| Date/Time/Duration |
| *** No Entries *** |
| ESC |
| Or: |
| Surge Log |
| Date/Time/Duration |
| 03/19/11 22:35 99M |
| { }         ESC |

The current and 24 hour Surge events will be updated every minute. The permanently logged events will be performed daily. The current and 24 hour information will be presented to the communications system 54 for upstream use.

Proposed Counter CIBs:
eAPP_Surge_Current_Duration (0 if not in a Surge)
eAPP_Surge_24_Hour_Avg
eAPP_Surge_24_Hour_Min
eAPP_Surge_24_Hour_Max
eAPP_Surge_Life_Count
eAPP_Surge_Life_Time
eAPP_Surge_Life_Min
eAPP_Surge_Life_Max The current Surge event time can be calculated from the eAPP_Surge_Current_Duration variable.

The utility diagnostic module may establish a web page containing the following reports:

Report 1 (updated every minute)
Current Status "SURGEs",
Current Event Time "V",
Past 24 Hours Average Qty "W",
Past 24 Hour Maximum Time "X",
Past 24 Hour Minimum Time "Y".

Report 2 (updated every day)
History "SURGEs",
System Life Qty Events "Z",
Total Time in SURGE Mode "Z2",
Maximum Time in SURGE Mode "Z3",
Minimum Time in SURGE Mode "Z4".

An outage event is captured when an event causes the power supply to switch to the inverter. Self tests are typically not included as an outage. The main processor of the UPS system 24 transfers to the utility diagnostic module 74 information indicating inverter activation and deactivation. When the inverter is switched off, the duration of the Outage will then be permanently logged in memory. This function does not require an input screen.

A utility diagnostic module 74 detecting outage events may be configured to display the following utility performance screens indicating either "OK" or "EVT" if the power supply is currently in a utility event (Outage, Sag, Surge, Frequency).

| | | |
|---|---|---|
| Utility Perform | | EVT |
| Outages | | EVT |
| Sags | | |
| ENTR | } | ESC |

The scrollable list entries containing Outages, Sags, Surges, and Frequency will each have an "EVT" indicator as appropriate in real time. When the desired performance type is at the top of the list, pressing ENTR will select the current status for this event type if it is in progress, otherwise the display will show the 24 hour history:

| | |
|---|---|
| Outage In Progress | |
| Start Time | 23:52 |
| Duration | 999M |
| } ESC | |

If the down arrow (}) is pressed, the display will show the past 24 hours of status for this event type:

| | |
|---|---|
| Outage 24 Hr Histry | |
| Avg 333M | |
| Min 111M | Max 444M |
| ENTR { } | ESC |

If the down arrow (}) is pressed, the display will show the total history for this event type:

| | |
|---|---|
| Outage Total History | |
| Events 1111 = 9999M | |
| Min 222M | Max 333M |
| ENTR { | ESC |

Pressing ENTR will select a scrollable list of logged history for that type:

| |
|---|
| Outage Log |
| Date/Time/Duration |
| *** No Entries *** |
| ESC |
| Or: |
| Outage Log |
| Date/Time/Duration |
| 03/19/11 22:35 99M |
| { }    ESC |

The current and 24 hour Outage events will be updated every minute. The permanently logged events will be performed daily. The current and 24 hour information will be presented in communications module 54 for upstream use.
Proposed Counter CIBs:
eAPP_Outage_Current_Duration (0 if not in an Outage)
eAPP_Outage_24_Hour_Avg
eAPP_Outage_24_Hour_Min
eAPP_Outage_24_Hour_Max
eAPP_Outage_Life_Count
eAPP_Outage_Life_Time
eAPP_Outage_Life_Min
eAPP_Outage_Life_Max The current Outage event time can be calculated from the eAPP_Outage_Current_Duration variable.

The utility diagnostic module 74 may further provide a web page containing the following reports:
Report 1 (Updated every minute)
Current Status "OUTAGEs",
Current Event Time "V",
Past 24 Hours Average Qty "W",
Past 24 Hour Maximum Time "X",
Past 24 Hour Minimum Time "Y".
Report 2 (Updated every day)
History "OUTAGEs",
System Life Qty Events "Z",
Total Time in OUTAGE Mode "Z2",
Maximum Time in OUTAGE Mode "Z3",
Minimum Time in OUTAGE Mode "Z4".

The utility diagnostic module 74 captures frequency events when the input line is out of a tolerance of by ±3 Hz. Such frequency events will cause the inverter module 62 to operate.

The main processor of the UPS module 24 will inform the utility diagnostic module 74 when the input line frequency is out of tolerance. When the event ends, the duration of the event will then be permanently logged in memory. This function of the utility diagnostic module 74 does not require an input screen.

The utility diagnostic module 74 may generate a utility performance screen indicating either "OK" or "EVT" if the power supply is currently in a utility event (Outage, Sag, Surge, Frequency).

| | |
|---|---|
| Utility Perform | EVT |
| Frequency | EVT |
| ENTR { | ESC |

The scrollable list entries containing Outages, Sags, Surges and Frequency will each have an "EVT" indicator as appropriate in real time. When the desired performance type is at the top of the list, pressing ENTR will select the current status for this event type if it is in progress, otherwise the display will show the 24 hour history:

| | |
|---|---|
| Freq In Progress | |
| Start Time | 23:52 |
| Duration | 999M |
| ENTR   } | ESC |

If the down arrow (}) is pressed, the display will show the past 24 hours of status for this event type:

| | |
|---|---|
| Freq 24 Hr History | |
| Avg 333M | |
| Min 111M | Max 444M |
| ENTR { } | ESC |

If the down arrow (}) is pressed, the display will show the total history for this event type:

```
            Freq   Total History
            Events 1111 = 9999M
            Min 222M  Max 333M
            ENTR {        ESC
```

Pressing ENTR will select a scrollable list of logged history for that type:

```
                 Freq Log
              Date/Time/Duration
              *** No Entries ***
                              ESC
            Or:
                 Freq Log
              Date/Time/Duration
              03/19/11 22:35 99M
                  { }        ESC
```

The current and 24 hour Frequency events will be updated every minute. The permanently logged events will be performed daily. The current and 24 hour information will be presented in the communications system 54 for upstream use.

Proposed Counter CIBs:
eAPP_Frequency_Current_Duration (0 if not in a Frequency event)
eAPP_Frequency_24_Hour_Avg
eAPP_Frequency_24_Hour_Min
eAPP_Frequency_24_Hour_Max
eAPP_Frequency_Life_Count
eAPP_Frequency_Life_Time
eAPP_Frequency_Life_Min
eAPP_Frequency_Life_Max The current Frequency event time can be calculated from the eAPP_Frequency_Current_Duration variable.

The utility diagnostic module may establish a web page containing the following reports:
Report 1 (Updated every minute)
Current Status "FREQUENCY OUTAGE",
Current Event Time "V",
Past 24 Hours Average Qty "W",
Past 24 Hour Maximum Time "X",
Past 24 Hour Minimum Time "Y".
Report 2 (Updated every day)
History "FREQUENCY OUTAGEs",
System Life Qty Events "Z",
Total Time in FREQUENCY OUTAGE Mode "Z2",
Maximum Time in FREQUENCY OUTAGE Mode "Z3",
Minimum Time in FREQUENCY OUTAGE Mode "Z4".

4. XFMR Diagnostic Module

The XFMR diagnostic module 76 estimates the age the transformer module 64 and generates current and projected status information associated with warning and replacement alarms. In the example transformer module 64, the oil resonant capacitor is the life-limited device and as such will be the benchmark for the calculations.

A system MTBF may be calculated using a predetermined temperature profile such as: 50% operation at 20° C. enclosure ambient; 33% operation at 30° C. enclosure ambient; 15% operation at 40° C. enclosure ambient; and 2% operation at 60° C. enclosure ambient. The enclosure ambient temperature is external to the power system 50 and internal to the weather proof enclosure of the UPS system 24.

Based on experimental testing, an offset value may be added to the measured operational temperature of the oil capacitor (life-limited component).

A weighted average of this profile may be calculated to determine a baseline value. The baseline value may be even lower to incorporate a safety margin to the MTBF calculations. The life of the component will be determined using the MTBF calculations and be used as the rated life value.

The primary aging factor for the Oil Capacitor is the temperature at which it operates. In particular, the design life of an Oil Capacitor is typically rated for a predetermined number of hours at a predetermined operating temperature.

The aging algorithm may further be modified such that the device ages a minimum of 1 day every calendar day even if the effective calculated age is less than one day per calendar day at temperatures less than the baseline value.

The temperature is sampled hourly and averaged daily. Once the daily average is calculated, the resultant aging will be determined by one of the following two methods.

If the average daily temperature is greater than or equal to 27 C, the transformer age in days equals accumulated age of the last sample in days plus $2^{[(sample\ temp-baseline\ value)/10]}$. Therefore, for every 10 degree rise over the baseline value, the aging rate doubles. In other words, at baseline plus 10 average for a day, the transformer has aged two days.

If the average daily temperature is less than 27 C, the transformer age in days equals the accumulated age in days of the last sample plus 1 day.

Given the foregoing, the remaining life in days equals the expected life in days less the transformer age in days.

A WRN warning alarm will be generated if the remaining life is less than six months.

REP (replace) alarms will be generated under the following conditions:
Line Isolation Alarm
Utility OK but Output Voltage out of range
Charger failed but Inverter operates OK
Incorrect Input/Output Voltage and Current out of tolerance The main processor of the UPS system 20 communicates real time temperature value to the XFMR diagnostic module 76. The main processor also provides messages for the various REP conditions. This function of the XFMR diagnostic module 76 requires not input screens.

In the example XFMR diagnostic module 76, the design life of the transformer and the alarm threshold for WRN or REP are hard coded into the firmware. The main processor must provide the manufacturing date of the transformer as a logged configuration record.

The XFMR diagnostic module displays a Transformer Health screen that may be selected from the main menu.

```
            AlphaAPP v1.0 Status
            Transformer Health
            Utility Performance
            ENTR { }   ESC
```

Pressing ENTR selects the Transformer Health screen. The first line will indicate OK, WRN, or REP as a worst case analysis the XM3 transformer.

Transformer WRN
Install Date April 2011
Life Remaining 1M
ESC

The following screens show the REP alarms:
Transformer REP
Line Isolation Fault
ESC
Or:
Transformer REP
Utility OK,
Output Out Of Range
ESC
Or;
Transformer REP
Inverter OK,
Charger Failure
ESC
Or;
Transformer REP
Incorrect In/Out V &
Current Out Of Tol
ESC
Ho The XFMR will present status information to the communication system 56 hourly for upstream use.

Proposed Counter CIBs:
eAPP_Transformer_1_Status (0=OK, 1=WRN (generates minor alarm), 2=REP (generates major alarm)
eAPP_Transformer_Months_Life_Remaining (0 to 264)

The XFMR diagnostic module 76 should generate a web page containing the following report:
Report 1 (Updated every day)
Transformer Status (OK, WRN or REP), and
Transformer Life Remaining in Months.

Given the foregoing, it should be apparent that the principles of the present invention may be embodied in forms other than those described above. The scope of the present invention should thus be determined the claims to be appended hereto and not the foregoing detailed description of the invention.

What is claimed is:

1. A diagnostic system for a UPS module comprising a power system comprising a battery module, an inverter module, and a transformer module, where the power system is arranged between a utility power supply supplying a utility power signal and a communications system comprising at least one load, the diagnostic system comprising:
    a battery diagnostic module configured to generate battery diagnostic information based on at least one operating characteristic of at least one element of the battery module, where the battery diagnostic information comprises
        current status information indicative of performance of the battery module if the power system is operated in a standby mode when the battery diagnostic information is generated, and
        projected status information indicative of projected performance of the battery module should the power system be operated in standby mode at some point in time after the diagnostic information is generated,
    an inverter diagnostic module configured to generate inverter diagnostic information based on at least one operating characteristic of at least one element of the inverter module, where the inverter diagnostic information is indicative of mean time between failure of the inverter module,
    a utility diagnostic module configured to generate utility diagnostic information based on at least one operating characteristic of at least one element of the utility power signal supplied by the utility power supply, and
    a transformer diagnostic module configured to generate transformer diagnostic information based on at least one operating characteristic of at least one element of the transformer module, where the transformer diagnostic information is indicative of mean time between failure of the transformer module.

2. The diagnostic system of claim 1, further comprising a communications module operatively connected between the diagnostic module and the communications system to transfer battery diagnostic information, inverter diagnostic information, utility diagnostic information, and transformer diagnostic information between the diagnostic system and the communications system.

3. The diagnostic system as recited in claim 1, in which the battery diagnostic module generates the battery diagnostic information based on at least one of voltage, current, internal battery temperature, ambient temperature, charge time, and discharge time associated with the battery module.

4. The diagnostic system as recited in claim 1, in which the inverter diagnostic module generates the inverter diagnostic information based on a temperature associated with the inverter module.

5. The diagnostic system as recited in claim 1, in which the inverter diagnostic information is at least partly expressed as inverter age in days.

6. The diagnostic system as recited in claim 1, in which:
    if an average daily temperature associated with the inverter module is greater than or equal to a baseline temperature, the inverter age in days is equal to an accumulated age in days of a last sample+2^[(sample temp −baseline temperature)/10]; and
    if the average daily temperature associated with the inverter module is less than the baseline temperature, the inverter age in days is equal to the accumulated age in days of the last sample plus 1 day.

7. The diagnostic system as recited in claim 1, in which the utility diagnostic module that generates the utility diagnostic information based on at least one of line surges, line sags, line outages, and line frequency deviation.

8. The diagnostic system as recited in claim 1, in which the transformer diagnostic module that generates the transformer diagnostic information based on a temperature of a resonant capacitor within the transformer module.

9. The diagnostic system as recited in claim 8, in which the inverter diagnostic module generates the transformer diagnostic information based on a temperature profile of the resonant capacitor.

10. A method for generating diagnostic information from a UPS module comprising a power system comprising a battery module, an inverter module, and a transformer module, where the power system is arranged between a utility power supply supplying a utility power signal and a communications system comprising at least one load, the method comprising the steps of:
    generating battery diagnostic information based on at least one operating characteristic of at least one element of the battery module, where the battery diagnostic information comprises current status information indicative of performance of the battery module if the power system is operated in the standby mode when the battery diagnostic information is generated, and projected status information indicative of projected performance of the battery module should the power system be operated in standby mode at some point in time after the diagnostic information is generated;

generating inverter diagnostic information based on at least one operating characteristic of at least one element of the inverter module, where the inverter diagnostic information is indicative of mean time between failure of the inverter module;

generating utility diagnostic information based on at least one operating characteristic of at least one element of the utility power signal supplied by the utility power supply;

generating transformer diagnostic information based on at least one operating characteristic of at least one element of the transformer module, where the transformer diagnostic information is indicative of mean time between failure of the transformer module.

11. The method as recited in claim 10, further comprising the step of transferring the battery diagnostic information, the inverter diagnostic information, the utility diagnostic information, and the transformer diagnostic information between the diagnostic module and the cable television system.

12. The method as recited in claim 10, in which the battery diagnostic information is generated based on at least one of voltage, current, internal battery temperature, ambient temperature, charge time, and discharge time associated with the battery module.

13. The method as recited in claim 10, in which the inverter diagnostic module generates the inverter diagnostic information based on a temperature associated with the inverter module.

14. The method as recited in claim 10, in which the inverter diagnostic information is at least partly expressed as inverter age in days.

15. The method as recited in claim 10, in which:
if an average daily temperature associated with the inverter module is greater than or equal to a baseline temperature, the inverter age in days is equal to an accumulated age in days of a last sample+2^[(sample temp −baseline temperature)/10]; and
if the average daily temperature associated with the inverter module is less than the baseline temperature, the inverter age in days is equal to the accumulated age in days of the last sample plus 1 day.

16. The method as recited in claim 10, in which the utility diagnostic information is generated based on at least one of line surges, line sags, line outages, and line frequency deviation.

17. The method as recited in claim 10, in which the transformer diagnostic information is generated based on a temperature of a resonant capacitor within the transformer module.

18. A diagnostic system for a UPS module comprising a power system comprising a battery module, an inverter module, and a transformer module, where the power system is arranged between a utility power supply supplying a utility power signal and a communications system comprising at least one load, the diagnostic system comprising:

a battery diagnostic module configured to generate battery diagnostic information based on at least one of voltage, current, internal battery temperature, ambient temperature, charge times, and discharge times associated with the battery module, where the battery diagnostic information comprises current status information indicative of performance of the battery module if the power system is operated in the standby mode when the battery diagnostic information is generated, and projected status information indicative of projected performance of the battery module should the power system be operated in standby mode at some point in time after the diagnostic information is generated, an inverter diagnostic module configured to generate inverter diagnostic information based on a temperature within the inverter module associated with an electrolytic capacitor within the inverter module, where the inverter diagnostic information is indicative of mean time between failure of the inverter module, a utility diagnostic module configured to generate utility diagnostic information based on at least one of line surges, line sags, line outages, and line frequency deviation of utility power signal supplied by the utility power supply, and a transformer diagnostic module configured to generate transformer diagnostic information based on a temperature of a resonant capacitor within the transformer module, where the transformer diagnostic information is indicative of mean time between failure of the transformer module; and a communications module operatively connected between the diagnostic module and the communications system to transfer battery diagnostic information, inverter diagnostic information, utility diagnostic information, and transformer diagnostic information between the diagnostic system and the cable television system.

19. The diagnostic system as recited in claim 18, in which:
if the average daily temperature is greater than or equal to a baseline temperature, an inverter age in days is equal to an accumulated age in days of a last sample+2^[(sample temp−baseline temperature)/10]; and
if the average daily temperature is less than the baseline temperature, the inverter age in days is equal to the accumulated age in days of the last sample plus 1 day.

20. The diagnostic system as recited in claim 18, in which the transformer diagnostic information is generated based on a temperature profile of the resonant capacitor.

* * * * *